US011133686B2

(12) United States Patent
Liang et al.

(10) Patent No.: US 11,133,686 B2
(45) Date of Patent: Sep. 28, 2021

(54) BATTERY MANAGEMENT DEVICE WITH VOLUME DETECTION AND FORCED DISCHARGE

(71) Applicant: ASUSTeK COMPUTER INC., Taipei (TW)

(72) Inventors: Kai-Chun Liang, Taipei (TW); Wei-Chen Tu, Taipei (TW); Hsiang-Jui Hung, Taipei (TW); Xiao-Feng Zhou, Taipei (TW); Wen-Hsiang Yang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 369 days.

(21) Appl. No.: 16/283,893

(22) Filed: Feb. 25, 2019

(65) Prior Publication Data

US 2019/0280499 A1 Sep. 12, 2019

(30) Foreign Application Priority Data

Mar. 9, 2018 (TW) .................................. 107108147

(51) Int. Cl.
*H02J 7/00* (2006.01)
*H01M 10/48* (2006.01)
(Continued)

(52) U.S. Cl.
CPC .......... *H02J 7/0031* (2013.01); *G01R 31/382* (2019.01); *H01M 10/44* (2013.01);
(Continued)

(58) Field of Classification Search
CPC ........ H02J 7/0031; H02J 7/007; H02J 7/0021; H02J 7/0024; H02J 7/00047;
(Continued)

(56) References Cited

U.S. PATENT DOCUMENTS 3,597,673 A * 8/1971 Burkett ................ H02J 7/00711
320/129
3,609,503 A * 9/1971 Burkett ................ H02J 7/00711
320/129

(Continued)

FOREIGN PATENT DOCUMENTS

CN 201749909 U 2/2011
CN 103607010 A 2/2014
(Continued)

*Primary Examiner* — John T Trischler
(74) *Attorney, Agent, or Firm* — McClure, Qualey & Rodack, LLP

(57) ABSTRACT

A battery management device includes a detection circuit, a charge control circuit, and a discharge control circuit. The detection circuit is configured to output a first control signal and a second control signal according to a volume of a rechargeable battery. The charge control circuit is electrically coupled to the rechargeable battery and the detection circuit, and configured to open a charge loop of the rechargeable battery according to the first control signal. The discharge control circuit is electrically coupled to the rechargeable battery and the detection circuit, and configured to close a discharge path of the rechargeable battery according to the second control signal.

8 Claims, 12 Drawing Sheets

(51) Int. Cl.
*H01M 10/44* (2006.01)
*G01R 31/382* (2019.01)

(52) U.S. Cl.
CPC ............ *H01M 10/48* (2013.01); *H02J 7/007* (2013.01); *H02J 7/0021* (2013.01); *H02J 7/0024* (2013.01)

(58) Field of Classification Search
CPC .... H02J 7/00038; H02J 7/0029; H02J 7/0068; H02J 7/0045; H01M 10/425; H01M 10/48; H01M 10/44
USPC ......................................................... 320/134
See application file for complete search history.

(56) References Cited

U.S. PATENT DOCUMENTS

| | | | | |
|---|---|---|---|---|
| 3,614,583 A * | 10/1971 | Burkett | H02J 7/00711 | 320/129 |
| 3,652,915 A * | 3/1972 | Eberts | H02J 7/007188 | 320/141 |
| 3,683,256 A * | 8/1972 | Mas | H02J 7/00719 | 320/129 |
| 3,892,980 A * | 7/1975 | Anderson | H03K 17/30 | 307/116 |
| 4,207,514 A * | 6/1980 | Klein | H02J 7/0078 | 320/134 |
| 4,661,759 A * | 4/1987 | Klein | G01R 31/378 | 320/134 |
| 5,488,282 A * | 1/1996 | Hayden | H02J 7/0022 | 320/118 |
| 5,633,576 A * | 5/1997 | Rose | H02J 7/007184 | 320/160 |
| 5,652,392 A * | 7/1997 | Lawson | G01F 23/266 | 324/678 |
| 5,652,393 A * | 7/1997 | Lawson | G01F 23/266 | 374/E7.031 |
| 5,750,285 A * | 5/1998 | Akutagawa | H01M 10/48 | 429/92 |
| 5,808,446 A * | 9/1998 | Eguchi | H02J 7/00711 | 320/134 |
| 5,929,593 A * | 7/1999 | Eguchi | H02J 7/00711 | 320/139 |
| 6,399,246 B1 * | 6/2002 | Vandayburg | H01M 4/621 | 429/217 |
| 6,664,000 B1 * | 12/2003 | Sonobe | H01M 10/425 | 429/61 |
| 6,835,491 B2 * | 12/2004 | Gartstein | H01M 10/4257 | 429/92 |
| 7,514,903 B2 * | 4/2009 | Lee | H02J 7/00309 | 320/150 |
| 7,592,776 B2 * | 9/2009 | Tsukamoto | H01M 10/44 | 320/136 |
| 8,378,636 B2 * | 2/2013 | Wu | H01M 10/441 | 320/134 |
| 8,691,408 B2 * | 4/2014 | Hong | H01M 50/578 | 429/61 |
| 8,729,850 B2 * | 5/2014 | Utsuno | H02J 7/35 | 320/102 |
| 8,877,370 B2 * | 11/2014 | Kim | H01M 10/48 | 429/185 |
| 8,896,271 B2 * | 11/2014 | Kim | H01M 10/486 | 320/136 |
| 8,963,480 B2 * | 2/2015 | Utsuno | H02J 7/00 | 320/101 |
| 8,983,733 B2 * | 3/2015 | Knight-Newbury | B60L 3/0092 | 701/45 |
| 9,263,900 B2 * | 2/2016 | Ju | B60L 58/20 | |
| 9,281,545 B2 * | 3/2016 | Nomura | H02J 7/0016 | |
| 9,337,687 B2 * | 5/2016 | Utsuno | H02J 7/00 | |
| 9,391,311 B2 * | 7/2016 | Xie | H01M 50/572 | |
| 9,716,404 B2 * | 7/2017 | Tu | H02J 7/04 | |
| 9,753,512 B2 * | 9/2017 | Tsai | G06F 1/266 | |
| 9,780,599 B2 * | 10/2017 | Huang | H02J 50/80 | |
| 9,837,836 B2 * | 12/2017 | Li | H02J 7/007 | |
| 9,887,578 B2 * | 2/2018 | Utsuno | H02J 7/00 | |
| 9,917,335 B2 * | 3/2018 | Jarvis | H01M 10/4257 | |
| 10,063,067 B2 * | 8/2018 | Chiueh | H02J 7/0068 | |
| 10,075,014 B2 * | 9/2018 | Utsuno | H02J 7/00 | |
| 10,305,308 B2 * | 5/2019 | Tsai | H02J 7/007 | |
| 10,312,701 B2 * | 6/2019 | Li | H02J 7/0071 | |
| 10,581,263 B2 * | 3/2020 | Chee | H02J 7/0072 | |
| 10,630,101 B2 * | 4/2020 | Hsieh | H02J 7/0019 | |
| 10,693,313 B2 * | 6/2020 | Tseng | H02J 1/04 | |
| 10,741,883 B2 * | 8/2020 | Maresh | H01M 10/4257 | |
| 10,847,846 B2 * | 11/2020 | Jarvis | H01M 10/4257 | |
| 10,897,198 B2 * | 1/2021 | Chen | H02M 3/158 | |
| 2002/0001745 A1 * | 1/2002 | Gartstein | H01M 10/4257 | 429/61 |
| 2003/0027036 A1 * | 2/2003 | Emori | H01M 50/581 | 429/61 |
| 2005/0029990 A1 * | 2/2005 | Tsukamoto | H01M 10/44 | 320/135 |
| 2005/0116686 A1 * | 6/2005 | Odaohhara | H02J 7/0025 | 320/116 |
| 2006/0076926 A1 * | 4/2006 | Lee | H02J 7/0047 | 320/112 |
| 2006/0093896 A1 * | 5/2006 | Hong | H01M 10/425 | 429/61 |
| 2007/0279010 A1 * | 12/2007 | Okamura | H02J 7/345 | 320/166 |
| 2009/0140696 A1 * | 6/2009 | Okuto | G01R 31/3648 | 320/134 |
| 2010/0207582 A1 * | 8/2010 | Wu | H01M 10/425 | 320/134 |
| 2011/0121787 A1 * | 5/2011 | Kim | H01M 10/46 | 320/134 |
| 2011/0127945 A1 * | 6/2011 | Yoneda | H02J 7/0031 | 320/101 |
| 2012/0086387 A1 * | 4/2012 | Utsuno | H02J 7/00 | 320/102 |
| 2012/0121942 A1 * | 5/2012 | Kim | H01M 10/48 | 429/7 |
| 2012/0150393 A1 * | 6/2012 | Knight-Newbury | H02H 5/08 | 701/45 |
| 2013/0043841 A1 * | 2/2013 | Wei | H02J 7/00711 | 320/118 |
| 2013/0106173 A1 * | 5/2013 | Nomura | B60L 58/15 | 307/9.1 |
| 2013/0175975 A1 * | 7/2013 | Shinozaki | H02J 1/10 | 320/106 |
| 2013/0249494 A1 * | 9/2013 | Ju | B60L 3/0046 | 320/134 |
| 2014/0057141 A1 * | 2/2014 | Mosso | H01M 8/188 | 429/51 |
| 2014/0065453 A1 * | 3/2014 | Schaefer | H01M 10/48 | 429/61 |
| 2014/0103880 A1 * | 4/2014 | Schaefer | H01M 10/486 | 320/134 |
| 2014/0232321 A1 * | 8/2014 | Utsuno | H02J 7/00 | 320/101 |
| 2014/0342193 A1 * | 11/2014 | Mull | H01M 10/4257 | 429/50 |
| 2014/0375276 A1 * | 12/2014 | Zeier | H01M 10/06 | 320/145 |
| 2015/0130399 A1 * | 5/2015 | Utsuno | H02J 7/35 | 320/101 |
| 2016/0064780 A1 * | 3/2016 | Jarvis | H01M 10/48 | 429/50 |
| 2016/0149275 A1 * | 5/2016 | Minamiura | H02J 7/00719 | 320/107 |
| 2016/0218531 A1 * | 7/2016 | Li | H02J 7/00308 | |
| 2016/0218542 A1 * | 7/2016 | Li | H02J 7/007 | |
| 2016/0233718 A1 * | 8/2016 | Utsuno | H02J 7/00 | |
| 2017/0025878 A1 * | 1/2017 | Tsai | H02J 7/0068 | |
| 2018/0069428 A1 * | 3/2018 | Hsieh | H02J 7/36 | |
| 2018/0159183 A1 * | 6/2018 | Jarvis | H01M 10/4257 | |
| 2018/0159363 A1 * | 6/2018 | Utsuno | H02J 7/35 | |
| 2018/0269706 A1 * | 9/2018 | Chee | H02J 7/00 | |

(56) References Cited

U.S. PATENT DOCUMENTS

| | | | |
|---|---|---|---|
| 2019/0165430 A1* | 5/2019 | Maresh | H01M 10/445 |
| 2020/0212685 A1* | 7/2020 | Chee | H02J 7/0063 |
| 2020/0335835 A1* | 10/2020 | Song | H02J 7/0019 |
| 2020/0363477 A1* | 11/2020 | Biehler | G01R 31/3648 |
| 2021/0075068 A1* | 3/2021 | Jarvis | H01M 10/4257 |
| 2021/0098831 A1* | 4/2021 | Dietze | G01R 19/16542 |
| 2021/0151815 A1* | 5/2021 | Milobar | H01M 10/653 |
| 2021/0151816 A1* | 5/2021 | Shayan | H01M 4/382 |
| 2021/0151817 A1* | 5/2021 | Jennings | H01M 10/052 |
| 2021/0151830 A1* | 5/2021 | Shayan | H01M 50/293 |
| 2021/0151839 A1* | 5/2021 | Niedzwiecki | H01M 10/052 |
| 2021/0151840 A1* | 5/2021 | Shayan | H01M 10/658 |
| 2021/0151841 A1* | 5/2021 | Johnson | H01M 50/578 |
| 2021/0175577 A1* | 6/2021 | Shiotani | H01M 50/147 |

FOREIGN PATENT DOCUMENTS

| | | | |
|---|---|---|---|
| CN | 205193244 U | * | 4/2016 |
| CN | 105572598 A | | 5/2016 |
| TW | 201213178 A | | 4/2012 |

* cited by examiner

US 11,133,686 B2

BATTERY MANAGEMENT DEVICE WITH VOLUME DETECTION AND FORCED DISCHARGE

CROSS-REFERENCE TO RELATED APPLICATION

The present disclosure claims the priority benefit of Taiwan Application Serial No. 107108147, filed on Mar. 9, 2018. The entirety of the above-mentioned patent application is hereby incorporated by reference herein and made a part of specification.

BACKGROUND OF THE INVENTION

Field of the Invention

The present disclosure relates to a battery management device, and in particular, to a battery management device that stops charging a rechargeable battery or discharging a rechargeable battery at the right time.

With the development of electronic science and technologies, rechargeable batteries are widely applied to various electronic devices, for example, handheld products, tablet computers and notebook computer products, and become indispensable electronic products in current days. However, if overcharged for a long time or repeatedly used, the rechargeable battery expands due to gas generated in the rechargeable battery, leading to an increase in internal pressure of the battery and a risk of explosion. In addition, over discharging for a long time also causes permanent damage to positive and negative electrodes of the rechargeable battery.

BRIEF SUMMARY OF THE INVENTION

An aspect of the present disclosure is a battery management device. According to an embodiment of the present disclosure, the battery management device includes a detection circuit, a charge control circuit, and a discharge control circuit. The detection circuit is configured to output a first control signal and a second control signal according to a volume of a rechargeable battery. The charge control circuit is electrically coupled to the rechargeable battery and the detection circuit, and configured to open a charge loop of the rechargeable battery according to the first control signal. The discharge control circuit is electrically coupled to the rechargeable battery and the detection circuit, and configured to close a discharge path of the rechargeable battery according to the second control signal.

BRIEF DESCRIPTION OF THE DRAWINGS

To make the aforementioned and other objectives, features, advantages, and embodiments of content of this disclosure more comprehensible, the accompanying drawings are described as follows.

DETAILED DESCRIPTION OF THE EMBODIMENTS

Unless otherwise particularly specified, all the terms as used throughout the whole specification and the claims of the present disclosure generally have the same meaning as are commonly understood by persons skilled in the art. The terms "first", "second", "third" and the like as used throughout the whole specification and the claims of the present disclosure are merely used for distinguishing between similar elements or operations that are described in the same technical terms and not necessarily for particularly describing a sequence in ranking or in any other manner, nor for limiting the present disclosure.

As used throughout the whole specification and the claims of the present disclosure, "coupled" or "electrically coupled" may mean that two or more elements are in either direct physical or electrical contact with each other or that two or more elements are in either indirect physical or electrical contact with each other, and "electrically coupled" may also refer to mutual operation or action between two or more elements.

Figure 1:
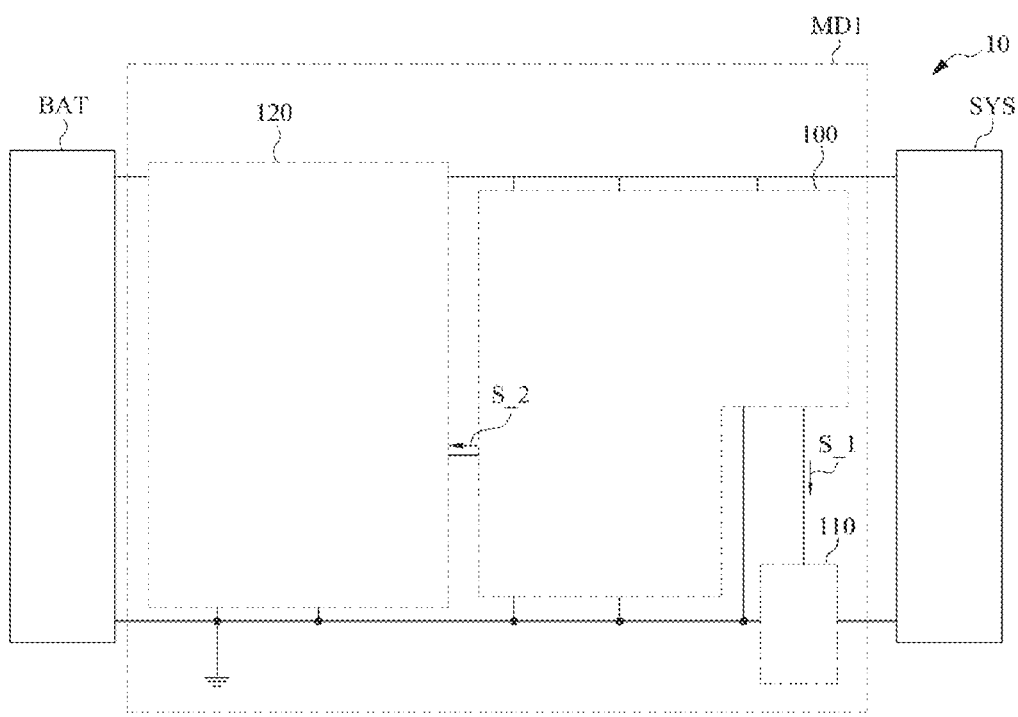
FIG. 1 is a schematic diagram of an electronic system according to an embodiment of the present disclosure.

Referring to FIG. 1, FIG. 1 is a schematic diagram of an electronic system 10 according to an embodiment of the present disclosure. The electronic system 10 includes a battery management device MD1, a rechargeable battery BAT, and a system circuit SYS. The battery management device MD1 is electrically coupled between the rechargeable battery BAT and the system circuit SYS, and includes a detection circuit 100, a charge control circuit 110, and a discharge control circuit 120.

The detection circuit 100 continuously detects a volume of the rechargeable battery BAT, and outputs control signals S_1 and S_2 according to the volume of the rechargeable battery BAT. The charge control circuit 110 is electrically coupled to the rechargeable battery BAT, the system circuit SYS, and the detection circuit 100, and opens a charge loop of the rechargeable battery BAT according to the control signal S_1. The discharge control circuit 120 is electrically coupled to the rechargeable battery BAT and the detection circuit 100, and closes a discharge path of the rechargeable battery BAT according to the control signal S_2. In an embodiment, when the rechargeable battery BAT expands to a preset volume value, the detection circuit 100 outputs the control signals S_1 and S_2 to the charge control circuit 110 and the discharge control circuit 120 according to a detection result. The charge control circuit 110 stops, according to the control signal S_1, the rechargeable battery BAT from being charged, to avoid continuous expansion of the rechargeable battery BAT; and the discharge control circuit 120 enables, according to the control signal S_2, the rechargeable battery BAT to discharge, to improve security of the electronic system 10.

Figure 2A:
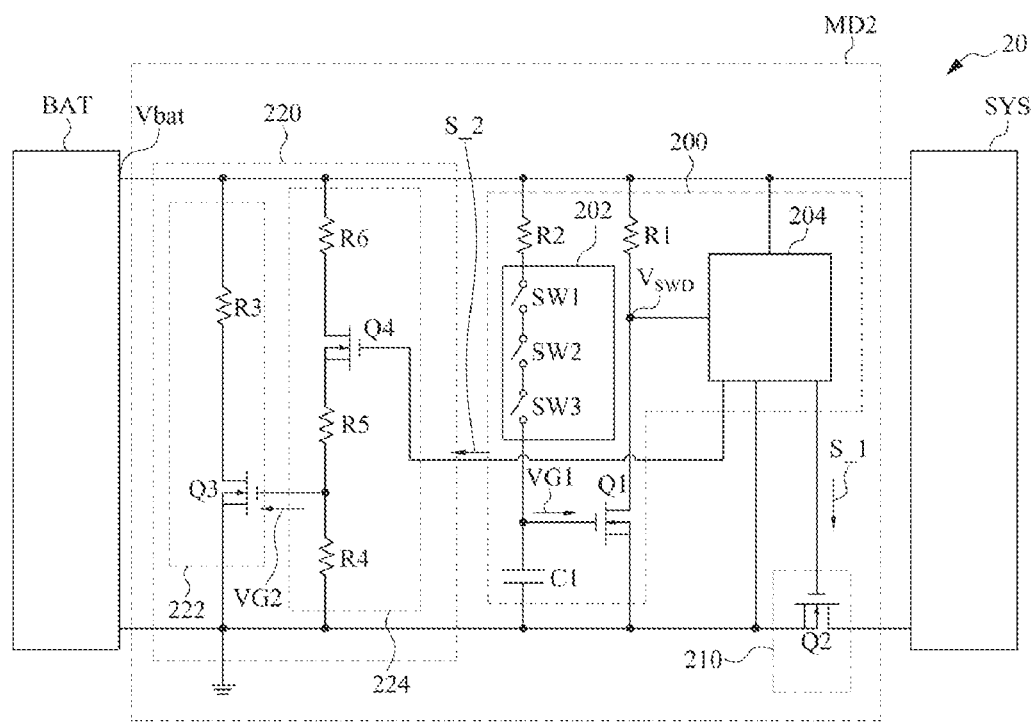
FIG. 2A is a schematic diagram of an electronic system according to an embodiment of the present disclosure.

Referring to FIG. 2A, FIG. 2A is a schematic diagram of an electronic system 20 according to an embodiment of the present disclosure. A battery management device MD2 of the electronic system 20 includes a detection circuit 200, a charge control circuit 210, and a discharge control circuit 220.

As shown in FIG. 2A, the detection circuit 200 includes a detection unit 202, a protective circuit 204, a capacitor C1, resistors R1 and R2, and a transistor Q1. The charge control circuit 210 includes a transistor Q2. The discharge control circuit 220 includes a discharge unit 222 and a switching unit 224. The discharge unit 222 includes a resistor R3 and a transistor Q3, to provide a discharge path. The switching unit 224 includes resistors R4 and R5, and a transistor Q4, and opens the discharge path of the rechargeable battery BAT when a voltage of the rechargeable battery BAT is lower than a preset voltage value.

Each of the transistors Q1 to Q4 includes a first end (for example, a source end), a second end (for example, a drain end), and a control end (for example, a gate end). In some embodiments, the transistors Q1 to Q4 are N-type transistors, but the disclosure is not limited thereto. In some other embodiments, the transistors Q1 to Q4 are P-type transistors.

In terms of structure, the detection unit 202 configured to detect the volume of the rechargeable battery BAT includes one or more switches. In some embodiments, the detection unit 202 includes switches SW1 to SW3 connected in series. A first end of the detection unit 202 is electrically coupled to a first end of the resistor R2. A second end of the detection unit 202 is electrically coupled to a first end of the capacitor C1 and the control end of the transistor Q1, and configured to output a control signal $V_{G1}$ to the control end of the transistor Q1. A second end of the capacitor C1 and the first end of the transistor Q1 are electrically coupled to a system ground contact GND, that is, the second end of the capacitor C1 and the first end of the transistor Q1 are grounded. The second end of the transistor Q1 is electrically coupled to a first end of the resistor R1 and the protective circuit 204, and configured to output a control signal $V_{SWD}$ to the protective circuit 204. A second end of the resistor R1 and a second end of the resistor R2 are electrically coupled to a battery voltage contact $V_{bat}$ of the rechargeable battery BAT, and configured to receive a voltage value of the rechargeable battery BAT.

The control end of the transistor Q2 of the charge control circuit 210 is electrically coupled to the protective circuit 204, to receive a control signal S_1. The first end of the transistor Q2 is electrically coupled to the system ground contact GND, that is, the first end of the transistor Q2 is grounded. The second end of the transistor Q2 is electrically coupled to a system circuit SYS.

As shown in FIG. 2A, in the switching unit 224, the control end of the transistor Q4 is electrically coupled to the detection circuit 200, and configured to receive a control signal S_2. The second end of the transistor Q4 is electrically coupled to the rechargeable battery BAT, and the first end of the transistor Q4 is electrically coupled to a first end of the resistor R5. A second end of the resistor R5 is electrically coupled to a first end of the resistor R4 and the control end of the transistor Q3 of the discharge unit 222. The first end of the transistor Q3 and a second end of the resistor R4 are electrically coupled to the system ground contact GND, that is, the first end of the transistor Q3 is grounded. The second end of the transistor Q3 is electrically coupled to a first end of the resistor R3, and a second end of the resistor R3 is electrically coupled to the rechargeable battery BAT. An input voltage of the control end of the transistor Q3 is a voltage $V_{G2}$.

In some embodiments, the transistor Q4 is electrically coupled between the battery voltage contact $V_{bat}$ of the rechargeable battery BAT and the resistors R4 and R5 that are connected in series, but the present disclosure is not limited thereto. In some other embodiments, the switching unit 224 of the discharge control circuit 220 further includes a resistor R6, which is electrically coupled between the second end of the transistor Q4 and the battery voltage contact $V_{bat}$.

Figure 2B:
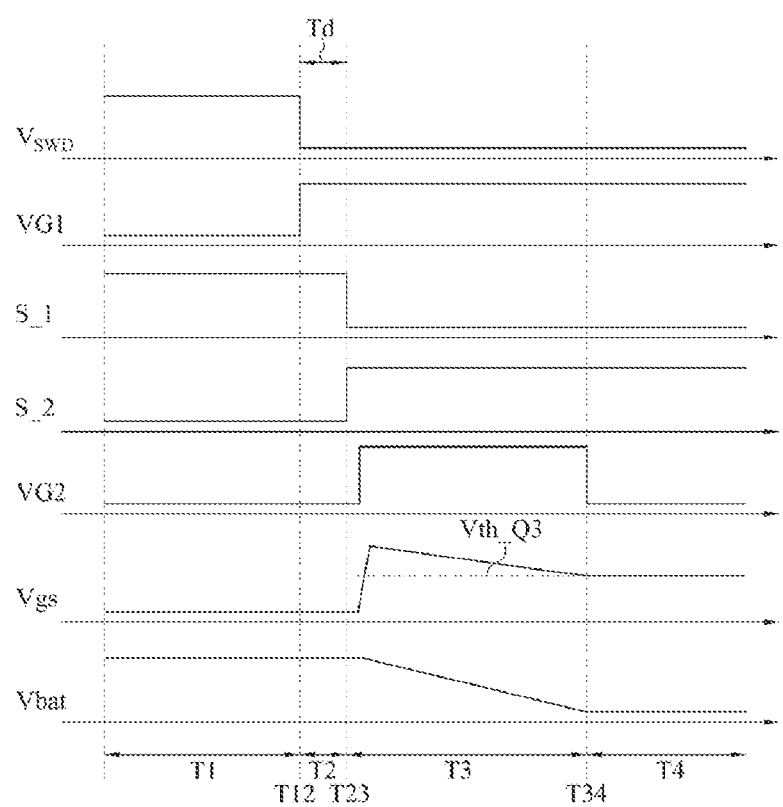
FIG. 2B is a diagram of an operation sequence of a battery management device in FIG. 2A operated in an operation mode.

Referring to FIG. 2A and FIG. 2B, FIG. 2B is a diagram of an operation sequence of the battery management device MD2 in FIG. 2A operated in an operation mode (that is, a protection mode). As shown in FIG. 2A and FIG. 2B, in duration T1, the detection unit 202 determines that the volume of the rechargeable battery BAT does not exceed a preset volume value, and the switches SW1 to SW3 form an open circuit. In this case, a cross voltage of the capacitor C1 is not adjusted, the transistor Q1 is not sufficient to be conducted, and a control signal $V_{SWD}$ at a high potential is transmitted from the first end of the resistor R1 to the protective circuit 204. The control signal S_1 output by the protective circuit 204 to the transistor Q2 is at a high potential. Therefore, the transistor Q2 is conducted, and the system circuit SYS is grounded by using the transistor Q2, so that the system circuit SYS normally operates and charges the rechargeable battery BAT, or the system circuit SYS outputs a control signal to charge the rechargeable battery BAT. The control signal S_2 output by the protective circuit 204 to the transistor Q4 is at a low potential, and the transistor Q4 is not conducted. A voltage (that is the cross voltage $V_{gs}$ in FIG. 2B) across the control end and the first end of the transistor Q3 is not greater than a critical voltage $V_{th\_Q3}$ of the transistor Q3, and the transistor Q3 is not conducted.

It should be additionally noted that, generally, in a process of using a device by a user, the user inevitably presses a particular position of a mobile phone, and if whether a battery expands is determined by using one detector at one detection point, incorrect determining on expansion of the battery may be caused because the user presses a particular position of a back cover and presses the foregoing detection point (actually the battery does not expand and the incorrect determining is made due to pressing of the user). In an embodiment of this disclosed document, whether a battery expands is detected by means of multi-point detection to avoid the foregoing incorrect determining. In this embodiment, the detection unit 202 is provided with three switches SW1 to SW3 connected in series, and the three switches SW1 to SW3 are respectively located at three different positions. In an embodiment, only if the three switches SW1 to SW3 are all conducted, it is determined that the battery expands, and a touch by mistake caused by the user by pressing the mobile phone at one point is avoided.

In some cases, due to external interference such as the touch by mistake by the user, the detection unit 202 may incorrectly determine the volume of the rechargeable battery BAT. In an embodiment, at a time point T12, the detection unit 202 detects the volume of the rechargeable battery BAT and determines that the volume of the rechargeable battery BAT exceeds the preset volume value, the switches SW1 to SW3 form a closed circuit, and the detection unit 202 outputs a control signal $V_{G1}$ of a high potential to the first end of the capacitor C1. After the capacitor C1 is charged, the second end of the capacitor C1 outputs a high potential to the control end of the transistor Q1. When the cross voltage of the two ends of the capacitor C1 is greater than a critical voltage of the transistor Q1, the transistor Q1 is conducted, so that the potential of the second end of the transistor Q1 is equal to a potential at which the first end of the transistor Q1 is grounded, and the second end of the transistor Q1 outputs a control signal $V_{SWD}$ of a low potential to the protective circuit 204. To avoid an incorrect operation caused by incorrect determining on the volume, the protective circuit 204 continues to output the control signal S_1 of a high potential in duration T2. Therefore, the transistor Q2 is still conducted, and the rechargeable battery BAT is still charged. The protective circuit 204 continues to output the control signal S_2 of a low potential in the duration T2, and therefore, the transistors Q3 and Q4 are still not conducted.

In the duration T2, the protective circuit 204 continues to receive the control signal $V_{SWD}$ of a low potential. Once the duration T2 is greater than delay duration Td, the protective circuit 204 determines, at a time point T23, that the duration T2 in which the control signal $V_{SWD}$ continues to be at a low potential exceeds the delay duration Td, and determines that the volume of the rechargeable battery BAT actually exceeds the preset volume value, and no incorrect determining is made.

In duration T3, the control signal S_1 output by the protective circuit 204 of the detection circuit 200 to the transistor Q2 of the charge control circuit 210 is at a low potential. As a result, the transistor Q2 is not conducted, and the transistor Q2 cuts off the connection between the system circuit SYS and the system ground contact GND, that is, opens the charge loop of the rechargeable battery BAT, so that the system circuit SYS stops charging the rechargeable battery BAT. The control signal S_2 output by the protective circuit 204 to the transistor Q4 of the discharge control circuit 220 is at a high potential, the transistor Q4 is conducted, a current path is formed between the resistors R4 and R5, and a current sequentially flows through the battery voltage contact $V_{bat}$ of the rechargeable battery BAT, the transistor Q4, and the resistors R5 and R4, and then flows into the system ground contact GND, so that the voltage $V_{G2}$ is switched to a high potential. When a cross voltage of the two ends of the resistor R4 (that is, the cross voltage $V_{gs}$ in FIG. 2B) is greater than the critical voltage $V_{th\_Q3}$ of the transistor Q3, the transistor Q3 is conducted, and the current sequentially flows through the battery voltage contact $V_{bat}$ of the rechargeable battery BAT, the resistor R3, and the transistor Q3, and then flows into the system ground contact GND, to form a discharge path to discharge the rechargeable battery BAT.

As the rechargeable battery BAT discharges, a potential of the battery voltage contact $V_{bat}$ of the rechargeable battery BAT decreases. At a time point T34, the potential of the battery voltage contact $V_{bat}$ decreases. Consequently, the cross voltage of the two ends of the resistor R4 (that is, the cross voltage $V_{gs}$ in FIG. 2B) is less than the critical voltage $V_{th\_Q3}$ of the transistor Q3, the transistor Q3 enters a cut-off region and is not conducted. In this case, the rechargeable battery BAT stops discharging.

Figure 2C:
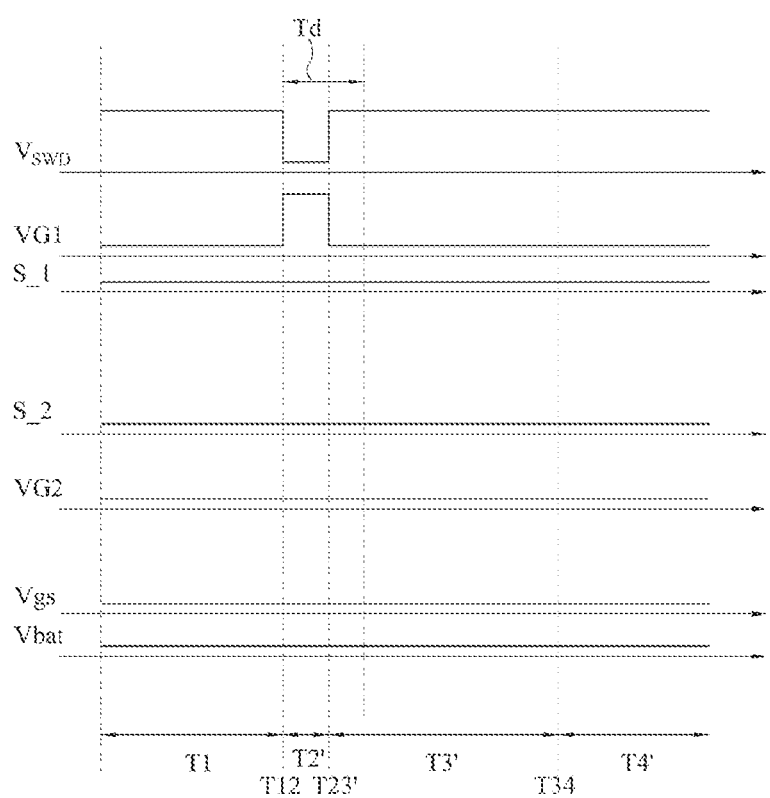
FIG. 2C is a diagram of an operation sequence of a battery management device in FIG. 2A operated in an operation mode.

In some embodiments, when the detection unit 202 incorrectly determines the volume of the rechargeable battery BAT, the protective circuit 204 makes further determining. Referring to FIG. 2C, FIG. 2C is a diagram of an operation sequence of the battery management device MD2 in FIG. 2A operated in an operation mode (that is, an incorrect determining mode). An operation case of FIG. 2C is similar to the operation case of FIG. 2B. Therefore, similar parts are not repeatedly described.

A difference lies in that, in duration T2', the protective circuit 204 continues to receive the control signal $V_{SWD}$ of a low potential. However, at a time point T23', the detection unit 202 determines that the volume of the rechargeable battery BAT does not exceed the preset volume value, the switches SW1 to the SW3 form an open circuit, and the capacitor C1 discharges. When the cross voltage of the two ends of the capacitor C1 is less than the critical voltage of the transistor Q1, the second end of the capacitor C1 outputs a low potential to the control end of the transistor Q1, and consequently, the transistor Q1 is not conducted. The control signal $V_{SWD}$ at a high potential is transmitted from the first end of the resistor R1 to the protective circuit 204.

At the time point T23', the protective circuit 204 receives the control signal $V_{SWD}$ of a high potential, and the protective circuit 204 determines that the duration T2' does not exceed the delay duration Td, that is, the duration T2' in which the control signal $V_{SWD}$ remains to be at a low potential does not exceed the delay duration Td. Therefore, the protective circuit 204 determines that the volume of the rechargeable battery BAT does not exceed the preset volume value, and the detection unit 202 incorrectly determines the volume of the rechargeable battery BAT. Therefore, the protective circuit 204 continues to output the control signal S_1 of a high potential in both the duration T2' and T3', the transistor Q2 is conducted, and the rechargeable battery BAT continues to be recharged. The protective circuit 204 continues to output the control signal S_2 of a low potential in both the duration T2' and T3', and therefore, the transistors Q3 and Q4 are not conducted.

Figure 3A:
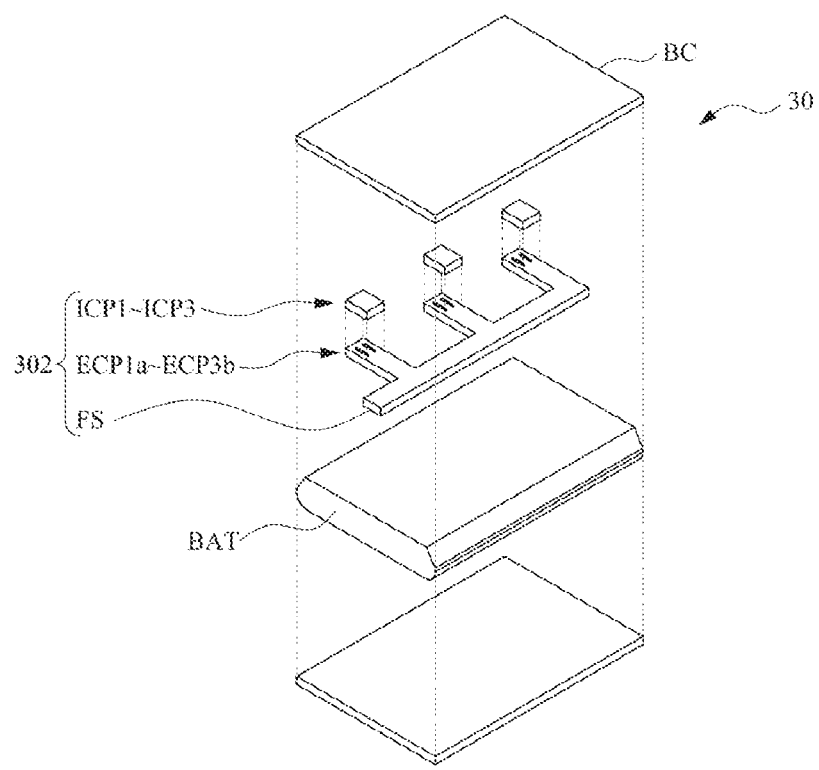
FIG. 3A is a schematic exploded view of an electronic system according to an embodiment of the present disclosure.
Figure 3B:
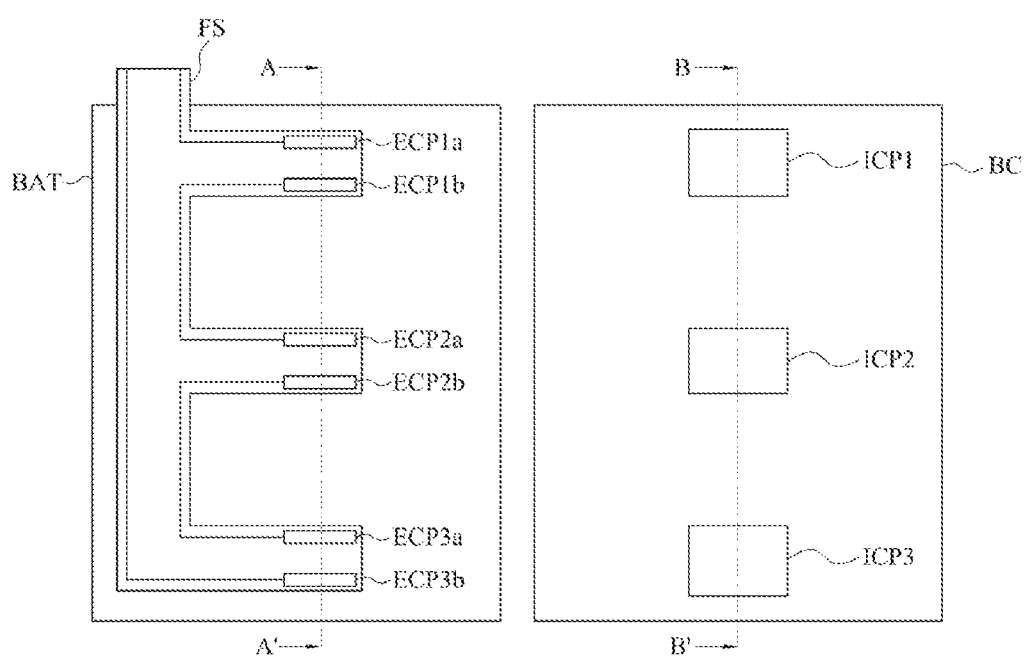
FIG. 3B is a schematic diagram of the electronic system in FIG. 3A.

Methods for detecting the volume of the rechargeable battery by the detection circuit may be adjusted depending on considerations on different designs. In an embodiment, the detection circuit may detect a changing degree of the volume of the rechargeable battery by means of contact statuses of a plurality of conductive plates. Referring to FIG. 3A and FIG. 3B, FIG. 3A is a schematic exploded view of an electronic system 30 according to an embodiment of the present disclosure, and FIG. 3B is a schematic diagram of the electronic system 30 in FIG. 3A. The electronic system 30 includes a battery back cover BC, a detection unit 302, and the rechargeable battery BAT shown in FIG. 2A. The detection unit 302 in FIG. 3A may be used as the detection unit 202 in FIG. 2A and applied to the electronic system 20.

In terms of structure, when combined, the detection unit 302 is disposed on an upper surface of the rechargeable battery BAT and located between the rechargeable battery BAT and the battery back cover BC. As shown in FIG. 3A, the detection unit 302 includes a flexible substrate FS, externally conductive plates (referring to externally conductive plates ECP1a to ECP3b in FIG. 3B) and a plurality of internally conductive plates (referring to internally conductive plates ICP1 to ICP3 in FIG. 3B). The internally conductive plates ICP1 to ICP3 are disposed respectively corresponding to three pairs of the externally conductive plates ECP1a and ECP1b, the externally conductive plates ECP2a and ECP2b, and the externally conductive plates ECP3a and ECP3b. The flexible substrate FS is disposed on the outer surface of the rechargeable battery BAT. As shown in FIG. 3A and FIG. 3B, the externally conductive plates ECP1a to ECP3b are disposed on the flexible substrate FS, and the internally conductive plates ICP1 to ICP3 are disposed on an inner surface of the battery back cover BC corresponding to the three pairs of the externally conductive plates ECP1a to ECP3b respectively. The battery back cover BC is used to cover or protect the outer surface of the rechargeable battery BAT, and the battery back cover BC may be arc-shaped.

As shown in FIG. 2A, FIG. 3A, and FIG. 3B, the detection unit 302 measures a distance between the battery back cover BC and the rechargeable battery BAT according to contact statuses between the externally conductive plates ECP1a to ECP3b and the internally conductive plates ICP1 to ICP3, so as to infer an expansion status of the volume of the rechargeable battery BAT and correspondingly output a control signal $V_{G1}$ to the control end of the transistor Q1. In an embodiment, when the externally conductive plates ECP1a and ECP1b are in contact with the internally conductive plate ICP1 to form a closed circuit, the externally conductive plates ECP2a and ECP2b are in contact with the internally conductive plate ICP2 to form a closed circuit, and the externally conductive plates ECP3a and ECP3b are in contact with the internally conductive plate ICP3 to form a closed circuit, the detection unit 302 determines that the volume of the rechargeable battery BAT exceeds a preset volume value.

In some embodiments, the detection unit 302 includes six externally conductive plates. In some other embodiments, the detection unit 302 includes 2N externally conductive plates, where N is a positive integer. In some embodiments, the externally conductive plates ECP1a to ECP3b may be at different heights respectively, but the present invention is not limited thereto. In some other embodiments, the externally conductive plates ECP1a to ECP3b are at a same height. In some other embodiments, the externally conductive plates ECP1a and ECP1b are at a same first height, the externally conductive plates ECP2a and ECP2b are at a same second height, the externally conductive plates ECP3a and ECP3b are at a same third height, and the second height is different from the first height or the third height.

Figure 3C:
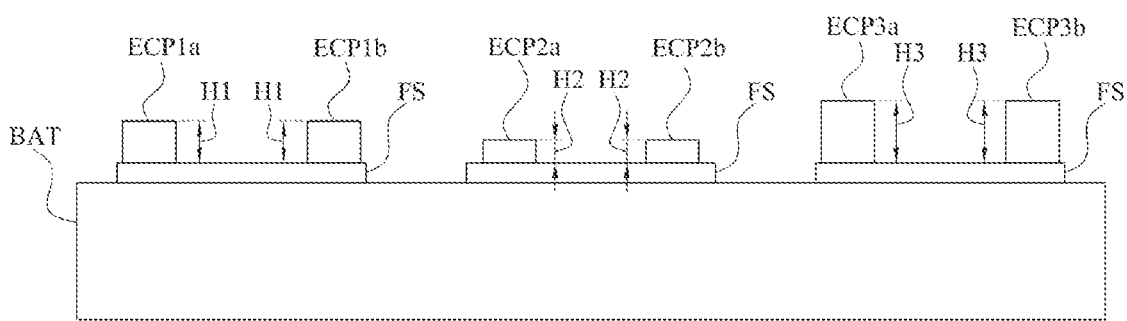
FIG. 3C is a schematic sectional view of a flexible substrate, an externally conductive plate, and a rechargeable battery in FIG. 3B.

Referring to FIG. 3A and FIG. 3B, FIG. 3C is a schematic sectional view, of the flexible substrate FS, the externally conductive plates ECP1a to ECP3b, and the rechargeable battery BAT in FIG. 3B, taken along A-A'. As shown in FIG. 3C, the externally conductive plates ECP1a to ECP3b may be at different heights H1 to H3 respectively, and in this case, the detection unit 302 may further measure whether the volume of the rechargeable battery BAT exceeds a first preset volume value, a second preset volume value, or a third preset volume value.

In an embodiment, the height H3 is set to be greater than the height H1, and the height H1 is set to be greater than the height H2. When the externally conductive plates ECP3a and ECP3b are in contact with the internally conductive plate ICP3, the detection unit 302 determines that the volume of the rechargeable battery BAT exceeds the first preset volume value. When the externally conductive plates ECP1a and ECP1b are also in contact with the internally conductive plate ICP1, the detection unit 302 determines that the volume of the rechargeable battery BAT exceeds the second preset volume value. When the externally conductive plates ECP2a and ECP2b are also in contact with the internally conductive plate ICP2, the detection unit 302 determines that the volume of the rechargeable battery BAT exceeds the third preset volume value. In the foregoing embodiment, the first preset volume value is less than the second preset volume value, and the second preset volume value is less than the third preset volume value.

In some embodiments, when the volume of the rechargeable battery BAT exceeds the first preset volume value, the electronic system 30 outputs an alarm message on a display to prompt the user. In some other embodiments, when the volume of the rechargeable battery BAT exceeds the second preset volume value, the electronic system 30 stops the rechargeable battery BAT from being charged.

Figure 3D:
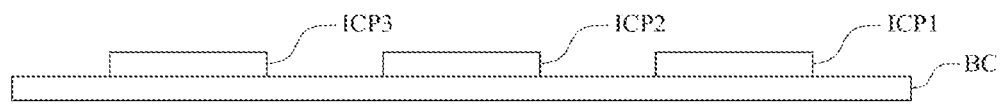
FIG. 3D is a schematic sectional view of a battery back cover and an internally conductive plate in FIG. 3B.

In some embodiments, the detection unit 302 includes one internally conductive plate. In some other embodiments, the detection unit 302 includes a plurality of internally conductive plates, disposed corresponding to a plurality of externally conductive plates respectively. In some embodiments, the internally conductive plates ICP1 to ICP3 each have a plane-shaped structure, but the present invention is not limited thereto. In some other embodiments, the internally conductive plates ICP1 to ICP3 each have an arc structure. In some other embodiments, the internally conductive plates ICP1 to ICP3 each have a step structure. Referring to FIG. 3D, FIG. 3D is a schematic sectional view, of the battery back cover BC and the internally conductive plates ICP1 to ICP3 in FIG. 3B, taken along B-B'. As shown in FIG. 3D, the internally conductive plates ICP1 to ICP3 each have a plane-shaped structure.

It may be learned from above that, although the detection unit 302 may incorrectly determine the volume of the rechargeable battery BAT because the externally conductive plate ECP1a to ECP3b come into contact with the internally conductive plates ICP1 to ICP3 when the user tightly holds the electronic system 30, the protective circuit 204 makes further determining. Therefore, only after the detection unit 302 continues to determine that the rechargeable battery BAT expands for a time longer than delay duration Td, the protective circuit 204 starts to determine that the rechargeable battery BAT actually expands, instructs the charge control circuit 210 to stop the rechargeable battery BAT from being charged, and instructs the discharge control circuit 220 to enable the rechargeable battery BAT to discharge, thereby improving security of the electronic system 30.

Figure 4A:
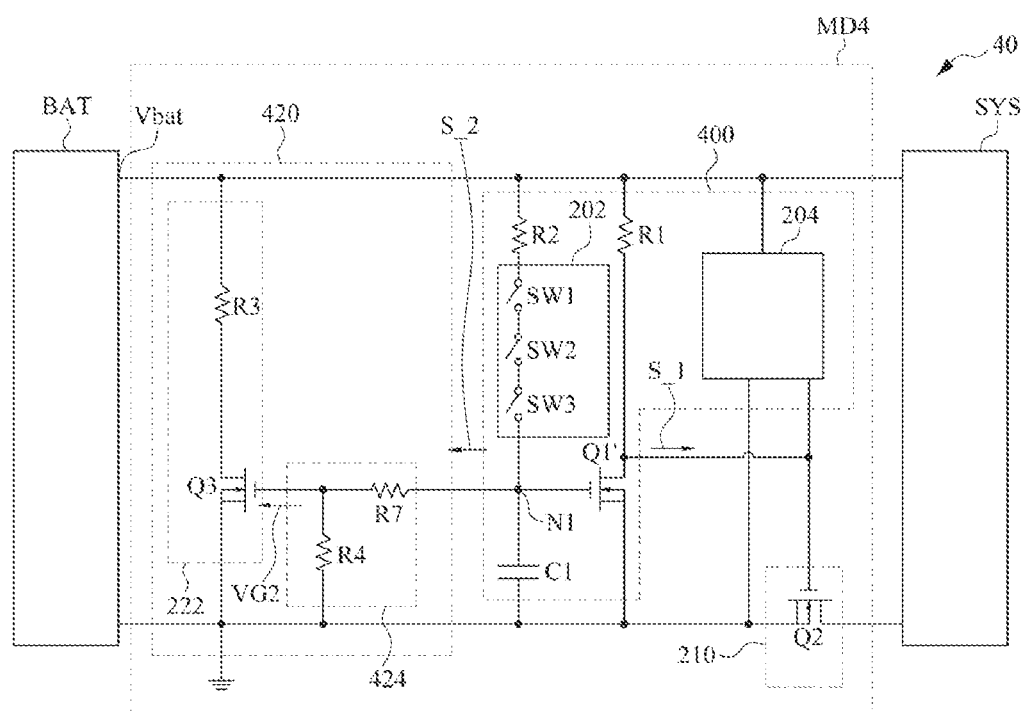
FIG. 4A is a schematic diagram of an electronic system according to an embodiment of the present disclosure.

Referring to FIG. 4A, FIG. 4A is a schematic diagram of an electronic system 40 according to an embodiment of the present disclosure. The electronic system 40 shown in FIG. 4A is substantially similar to the electronic system 20 shown in FIG. 2A, and therefore, similar elements are described with same symbols. A battery management device MD4 in the electronic system 40 includes a discharge control circuit 420, a detection circuit 400, and the charge control circuit 210 shown in FIG. 2A.

In terms of structure, as shown in FIG. 4A, the discharge control circuit 420 includes a switching unit 424 and the discharge unit 222 shown in FIG. 2A. The switching unit 424 is different from the switching unit 224 shown in FIG. 2A. The switching unit 424 includes a resistor R7 and a resistor R4. A first end of the resistor R7 is electrically coupled to the control end of the transistor Q3 of the discharge unit 222 and a first end of the resistor R4. A second end of the resistor R7 is electrically coupled to a second end of a detection unit 202 in the detection circuit 400, a first end of a capacitor C1, and a control end (that is, a node N1 in FIG. 4A) of a transistor Q1', and configured to receive a control signal S_2.

As shown in FIG. 4A, the detection circuit 400 includes the transistor Q1' and the detection unit 202, the protective circuit 204, the capacitor C1, and the resistors R1, and R2 that are shown in FIG. 2A. A control end of the transistor Q1' is electrically coupled to the first end (the node N1) of the capacitor C1, the second end of the detection unit 202, and the switching unit 424 in the discharge control circuit 420 are configured to output a control signal S_2 to the discharge control circuit 420. A first end of the transistor Q1' is electrically coupled to the second end of the capacitor C1 and a system ground contact GND, that is, the first end of the transistor Q1' is grounded. A second end of the transistor Q1' is electrically coupled to the first end of the resistor R1, the protective circuit 204, and the control end of the transistor Q2 in the charge control circuit 210, and the transistor Q1' is configured to output a control signal S_1 to the charge control circuit 210 and the protective circuit 204.

Figure 4B:
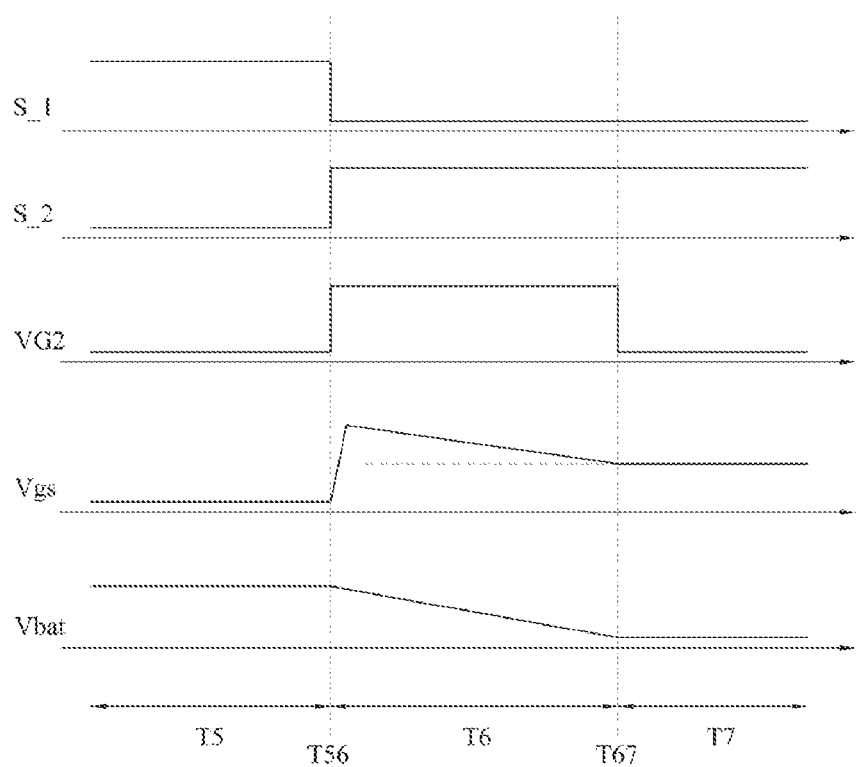
FIG. 4B is a diagram of an operation sequence of a battery management device in FIG. 4A operated in an operation mode.

Referring to FIG. 4B, FIG. 4B is a diagram of an operation sequence of a battery management device MD4 in FIG. 4A operated in an operation mode (that is, a protective mode). As shown in FIG. 4A and FIG. 4B, in duration T5, the detection unit 202 determines that a volume of the rechargeable battery BAT does not exceed a preset volume value, and switches SW1 to SW3 form an open circuit. In this case, a cross voltage of the capacitor C1 is not adjusted and the transistor Q1' is not sufficient to be conducted. The control signal S_1 at a high potential is transmitted from the first end of the resistor R1 to the charge control circuit 210, and therefore, the transistor Q2 of the charge control circuit 210 is conducted, and the system circuit SYS is grounded by using the transistor Q2, so that the system circuit SYS normally operates and charges the rechargeable battery BAT, or the system circuit SYS outputs a control signal to charge the rechargeable battery BAT. The first end (the node N1) of the capacitor C1 further outputs a control signal S_2 to the switching unit 424. However, the control signal is not sufficient to enable the transistor Q3 to be conducted after the voltage is divided by the resistor. An input voltage of the control end of the transistor Q3 is a voltage $V_{G2}$.

At a time point T56, the detection unit 202 detects the volume of the rechargeable battery BAT and determines that the volume of the rechargeable battery BAT exceeds the preset volume value, the switches SW1 to SW3 form a closed circuit, and the detection unit 202 outputs a control signal $V_{G1}$ of a high potential to the first end of the capacitor C1. After the capacitor C1 is charged, the first end (the node N1) of the capacitor C1 outputs a high potential to the control end of the transistor Q1'. When the cross voltage of two ends of the capacitor C1 is greater than a critical voltage of the transistor Q1', the transistor Q1' is conducted, so that a potential of the second end of the transistor Q1' is equal to a potential at which the first end of the transistor Q1' is grounded. The second end of the transistor Q1' outputs a control signal S_1 of a low potential to the charge control circuit 210. Therefore, the transistor Q2 of the charge control circuit 210 is not conducted, and the transistor Q2 cuts off the connection between the system circuit SYS and the system ground contact GND, that is, opens a charge loop of the rechargeable battery BAT, so that the system circuit SYS stops charging the rechargeable battery BAT.

At the time point T56, the switches SW1 to SW3 form a closed circuit, and the detection unit 202 also outputs the control signal S_2 of a high potential to the switching unit 424. In this case, a current may sequentially flows through a battery voltage contact $V_{bat}$ of the rechargeable battery BAT and the resistors R2, R7, and R4, and then flows into the system ground contact GND. The voltage $V_{G2}$ is switched to a high potential. When a cross voltage of two ends of the resistor R4 (that is, the cross voltage $V_{gs}$ in FIG. 4B) is greater than the critical voltage $V_{th\_Q3}$ of the transistor Q3, the transistor Q3 is conducted, and a current sequentially flows through the battery voltage contact $V_{bat}$ of the rechargeable battery BAT, the resistor R3, and the transistor Q3, and then flows into the system ground contact GND to form a discharge path, to enable the rechargeable battery BAT to discharge.

As the rechargeable battery BAT discharges, a potential of the battery voltage contact $V_{bat}$ of the rechargeable battery BAT decreases. At a time point T67, the potential of the battery voltage contact $V_{bat}$ decreases. Consequently, the cross voltage of the two ends of the resistor R4 (that is, the cross voltage $V_{gs}$ in FIG. 4B) is less than the critical voltage $V_{th\_Q3}$ of the transistor Q3, and the transistor Q3 enters a cut-off region and is not conducted. In this case, the rechargeable battery BAT stops discharging.

Figure 5:
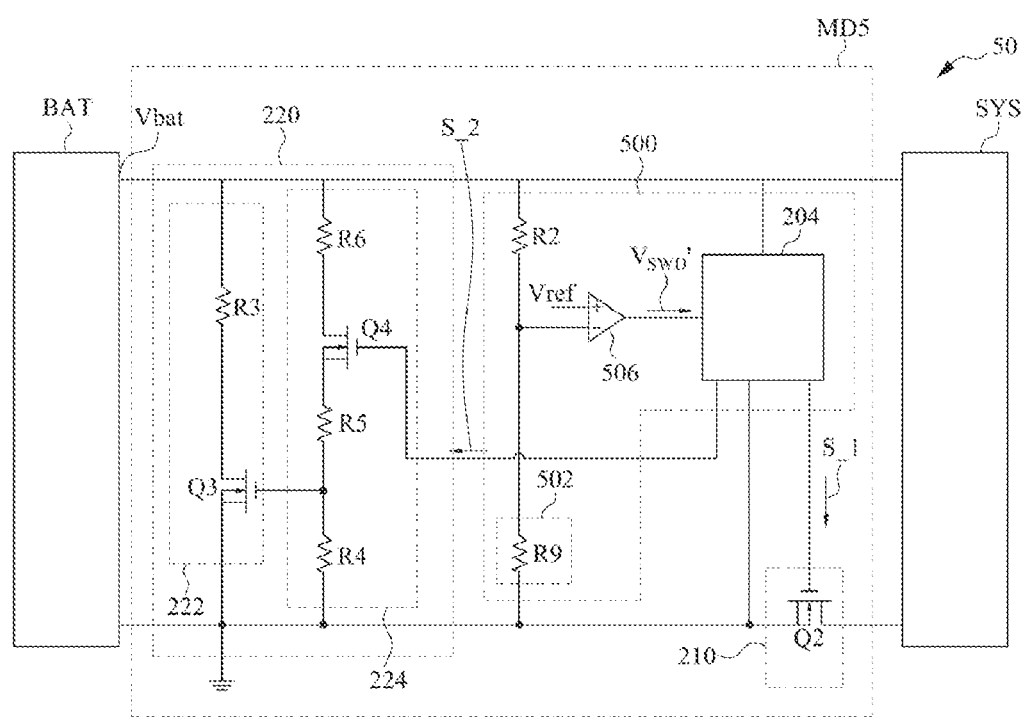
FIG. 5 is a schematic diagram of an electronic system according to an embodiment of the present disclosure.

Referring to FIG. 5, FIG. 5 is a schematic diagram of an electronic system 50 according to an embodiment of the present disclosure. The electronic system 50 shown in FIG. 5 is substantially similar to the electronic system 20 shown in FIG. 2A, and therefore, similar elements are described by using same symbols. A battery management device in the electronic system 50 includes a detection circuit 500 and the charge control circuit 210 and the discharge control circuit 220 that are shown in FIG. 2A.

In terms of structure, as shown in FIG. 5, the detection circuit 500 includes a resistor R2, a pressure detection unit 502, a comparator 506, and the protective circuit 204 shown in FIG. 2A. A first end of the pressure detection unit 502 is electrically coupled to a system ground contact GND. A second end of the pressure detection unit 502 is electrically coupled to a first end of the resistor R2 and a negative input end of the comparator 506, and configured to output a control signal to the negative input end of the comparator 506. A second end of the resistor R2 is electrically coupled to a battery voltage contact $V_{bat}$ of a rechargeable battery BAT, and configured to receive a voltage value of the rechargeable battery BAT. A positive input end of the comparator 506 is electrically coupled to a reference voltage $V_{ref}$, and an output end of the comparator 506 outputs a control signal $V_{SWD'}$ to the protective circuit 204 according to a comparison result.

In some embodiments, the pressure detection unit 502 may be implemented by using a variable resistor. In an embodiment, as shown in FIG. 5, the pressure detection unit 502 includes a variable resistor R9. As a resistance value of the variable resistor R9 changes, the pressure detection unit 502 outputs different control signals to the negative input end of the comparator 506, and the output end of the comparator 506 correspondingly outputs different control signals $V_{SWD'}$ to the protective circuit 204. According to the control signals $V_{SWD'}$, the protective circuit 204 may determine an expansion status of the volume of the rechargeable battery BAT and correspondingly output control signals S_1 and S_2.

In some embodiments, the output end of the comparator 506 outputs the control signal $V_{SWD'}$ to the protective circuit 204 at a time point (for example, the time point T12 shown in FIG. 2B), and the protective circuit 204 correspondingly outputs the control signals S_1 and S_2 at another time point (for example, the time point T23 shown in FIG. 2B). However, the present invention is not limited thereto. In some other embodiments, the output end of the comparator 506 outputs the control signal $V_{SWD'}$ to the protective circuit 204 at a time point (for example, the time point T56 shown in FIG. 4B), and the protective circuit 204 correspondingly outputs the control signals S_1 and S_2 at the same time point (for example, the time point T56 shown in FIG. 4B).

Figure 6:
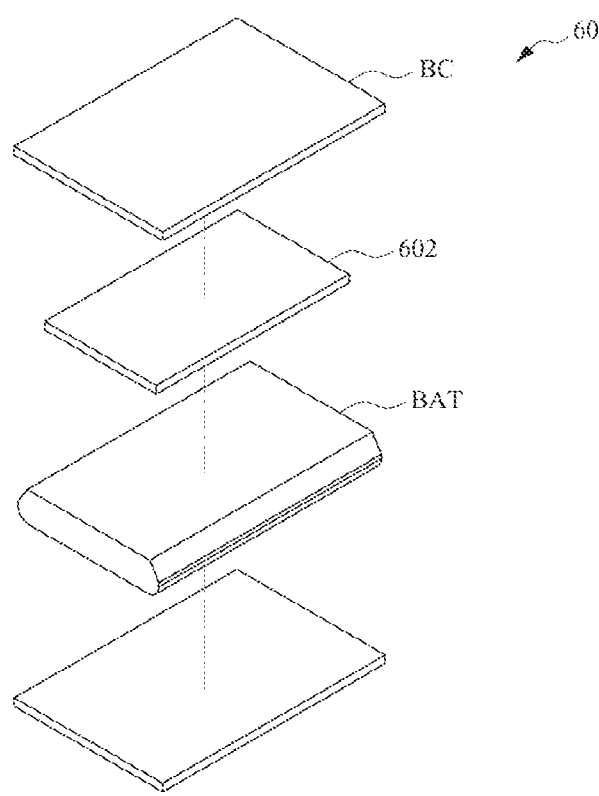
FIG. 6 is a schematic exploded view of an electronic system according to an embodiment of the present disclosure.

Methods for detecting the volume of the rechargeable battery by the detection circuit may be adjusted depending on considerations on different designs. In an embodiment, the detection circuit may detect the volume of the rechargeable battery by using a piezoelectric material. Referring to FIG. 6, FIG. 6 is a schematic exploded view of an electronic system 60 according to an embodiment of the present disclosure. The electronic system 60 includes a pressure detection unit 602, the battery back cover BC shown in FIG. 3A, and the rechargeable battery BAT shown in FIG. 5A. The pressure detection unit 602 in FIG. 6 may be used as the pressure detection unit 502 in FIG. 5 and applied to the electronic system 50.

When combined, the pressure detection unit 602 is adhered to an upper surface of the rechargeable battery BAT and located between the rechargeable battery BAT and the battery back cover BC, and the pressure detection unit 602 determines the volume of the rechargeable battery BAT by measuring a pressure on an outer surface of the rechargeable battery BAT. In an embodiment, when the rechargeable battery BAT expands, the rechargeable battery BAT presses the pressure detection unit 602, and the pressure detection unit 602 determines that the pressure on the outer surface of the rechargeable battery BAT increases. In some embodiments, the pressure detection unit 602 may be implemented by using a piezoelectric material, and in this case, a resistance value of the pressure detection unit 602 is related to the pressure applied on the pressure detection unit 602, and the resistor may be implemented by using the variable resistor R9 in FIG. 5. In some embodiments, when the pressure on the pressure detection unit 602 increases, a resistance of the pressure detection unit 602 decreases. However, the present invention is not limited thereto. In some other embodiments, when the pressure on the pressure detection unit 602 increases, a resistance of the pressure detection unit 602 increases.

In conclusion, by using the pressure detection unit such as the piezoelectric material or by detecting a contact status between the externally conductive plate and the internally conductive plate, the detection circuit can determine whether the rechargeable battery excessively expands. When the volume of the rechargeable battery exceeds a preset volume value, the charge control circuit stops the rechargeable battery from being charged, to avoid continuous expansion of the rechargeable battery. Moreover, the discharge control circuit enables the rechargeable battery to discharge, thereby improving security of the electronic system. To avoid incorrect determining of the volume of the rechargeable battery, the detection circuit instructs, after delay duration, the charge control circuit to stop the rechargeable battery from being charged, and instructs the discharge control circuit to enable the rechargeable battery to discharge.

Only some embodiments of the present disclosure are disclosed as above, and the embodiments are not used to limit the present disclosure. It should be noted that, persons of ordinary skill in the art may make adaptive changes and adjustments without departing from the spirit and scope of the present disclosure. The adaptive changes and adjustments shall fall within the scope of the present disclosure.

What is claimed is:

1. A battery management device, comprising:
   a detection circuit, configured to output a first control signal and a second control signal according to a volume of a rechargeable battery, wherein the detection circuit comprises:
   a battery back cover;
   a plurality of externally conductive plates disposed on an outer surface of the rechargeable battery; and
   a plurality of internally conductive plates disposed on an inner surface of the battery back cover, wherein the internally conductive plates correspond to the externally conductive plates respectively, two of the internally conductive plates or two of the externally conductive plates are at different heights, each of the internally conductive plates and corresponding one of the externally conductive plates form one of a plurality of switches, and the switches are connected in series;
   a charge control circuit, electrically coupled to the rechargeable battery and the detection circuit, and configured to open a charge loop of the rechargeable battery according to the first control signal; and
   a discharge control circuit, electrically coupled to the rechargeable battery and the detection circuit, and configured to close a discharge path of the rechargeable battery according to the second control signal.

2. The battery management device according to claim 1, wherein the detection circuit comprises:
   a detection unit comprising the externally conductive plates, the internally conductive plates and the battery back cover;
   a capacitor, comprising a first end and a second end, wherein the first end of the capacitor is electrically coupled to the detection unit, and the second end of the capacitor is electrically coupled to a system ground contact;
   a first resistor, comprising a first end and a second end, wherein the first end of the first resistor is electrically coupled to a battery voltage contact of the rechargeable battery; and
   a first transistor, configured to output a third control signal or the first control signal, and comprising a first end, a second end and a control end, wherein the first end of the first transistor is electrically coupled to the second end of the first resistor, the second end of the first transistor is electrically coupled to the system ground contact, and the control end of the first transistor is electrically coupled to the detection unit.

3. The battery management device according to claim 2, wherein
   the detection unit adjusts a potential of the control end of the first transistor according to a contact status between the externally conductive plates and the internally conductive plates.

4. The battery management device according to claim 2, wherein the detection circuit further comprises:
   a protective circuit, electrically coupled to the first end of the first transistor, and configured to receive the third control signal or the first control signal; and
   a second resistor, comprising a first end and a second end, wherein the first end of the second resistor is electrically coupled to the battery voltage contact, and the second end of the second resistor is electrically coupled to the detection unit.

5. The battery management device according to claim 4, wherein the protective circuit receives the third control signal at a first time point, and outputs the first control signal and the second control signal at a second time point.

6. The battery management device according to claim 4, wherein the discharge control circuit comprises:
   a discharge unit, configured to provide the discharge path, wherein the discharge unit comprises:
   a third resistor, comprising a first end and a second end, wherein the first end of the third resistor is electrically coupled to the rechargeable battery; and a second transistor, comprising a first end, a second end, and a control end, wherein the first end of the second transistor is electrically coupled to a second end of the third resistor, and the second end of the second transistor is electrically coupled to a system ground contact.

7. The battery management device according to claim 6, wherein the discharge control circuit further comprises:
   a switching unit, configured to open the discharge path of the rechargeable battery when a voltage of the rechargeable battery is lower than a preset voltage value, wherein the switching unit comprises:
   a fourth resistor, comprising a first end and a second end, wherein the first end of the fourth resistor is electrically coupled to the control end of the second transistor, and the second end of the fourth resistor is electrically coupled to the system ground contact;
   a third transistor, comprising a first end, a second end, and a control end, wherein the first end of the third transistor is electrically coupled to the rechargeable battery, the second end of the third transistor is electrically coupled to the first end of the fourth resistor, and the control end of the third transistor is electrically coupled to the detection circuit and configured to receive the second control signal; and
   a fifth resistor, comprising a first end and a second end, wherein the first end of the fifth resistor is electrically coupled to the first end or the second end of the third transistor, and the second end of the fifth resistor is electrically coupled to a battery voltage contact of the rechargeable battery or the control end of the second transistor.

8. The battery management device according to claim 6, wherein the discharge control circuit further comprises:
   a fourth resistor, comprising a first end and a second end, wherein the first end of the fourth resistor is electrically coupled to the control end of the second transistor, and the second end of the fourth resistor is electrically coupled to the system ground contact; and
   a fifth resistor, comprising a first end and a second end, wherein the first end of the fifth resistor is electrically coupled to the detection circuit, and the second end of the fifth resistor is electrically coupled to the control end of the second transistor.

* * * * *